United States Patent [19]
Tobben et al.

[11] Patent Number: 5,854,126
[45] Date of Patent: Dec. 29, 1998

[54] METHOD FOR FORMING METALLIZATION IN SEMICONDUCTOR DEVICES WITH A SELF-PLANARIZING MATERIAL

[75] Inventors: Dirk Tobben, Fishkill; Bruno Spuler, Wappingers Falls; Martin Gutsche, Poughkeepsie, all of N.Y.; Peter Weigand, Unterhaching, Germany

[73] Assignee: Siemens Aktiengesellschaft, Munich, Germany

[21] Appl. No.: 829,257

[22] Filed: Mar. 31, 1997

[51] Int. Cl.$^6$ .......................... H01L 21/469; H01L 21/312
[52] U.S. Cl. ........................... 438/626; 438/669; 438/636; 438/631; 438/760
[58] Field of Search .................................... 438/631, 636, 438/669, 720, 626, 760

[56] References Cited

U.S. PATENT DOCUMENTS

| | | |
|---|---|---|
| 4,758,305 | 7/1988 | Bonifield et al. . |
| 4,770,739 | 9/1988 | Orvek et al. . |
| 5,126,289 | 6/1992 | Ziger . |
| 5,264,076 | 11/1993 | Cuthbert et al. . |

*Primary Examiner*—Caridad Everhart
*Attorney, Agent, or Firm*—Stanton C. Braden

[57] ABSTRACT

A method for forming a plurality of electrically conductive wires on a substrate. The method includes forming a relatively non-planar metal layer over a surface of the substrate. A self-planarizing material is deposited over the metal layer. The self-planarizing material forms a planarization layer over the surface of the metal layer. The planarization layer has a surface relatively planar compared to the relatively non-planar metal layer. A photoresist layer is deposited over the surface of the planarization layer. The photoresist layer is patterned with a plurality of grooves to form a mask with such grooves exposing underling portions of the planarization layer. The photoresist mask is used as a mask to etch grooves in the exposed portions of the planarization layer and thereby form a second mask. The second mask exposes underling portions of the relatively non-planar metal layer. The second mask is used to etch grooves in the relatively non-planar conductive metal layer and thereby form the plurality of electrically conductive wires in the metal layer. The wires are separated from each other by the grooves formed in the relatively non-planar metal layer. The planarization layer is formed by a spinning-on an organic polymer, for example an organic polymer having silicon, or a flowable oxide, or a hydrogensilsequioxane, or divinyl-siloxane-benzocyclobutene. The metal layer is etched using reactive ion etching. The planarization layer is removed using a wet chemical etch.

3 Claims, 2 Drawing Sheets

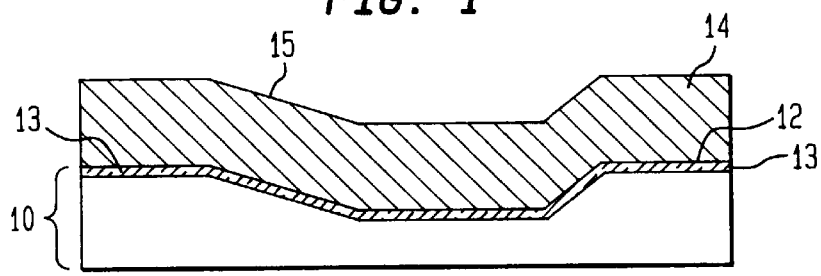
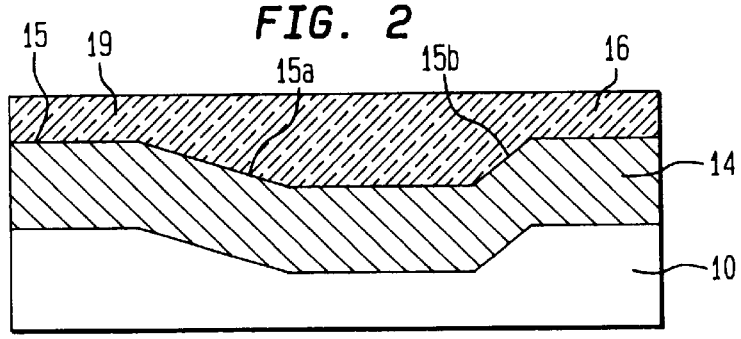
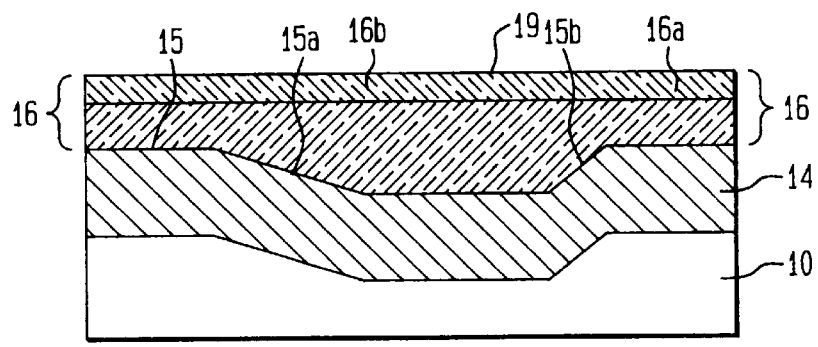
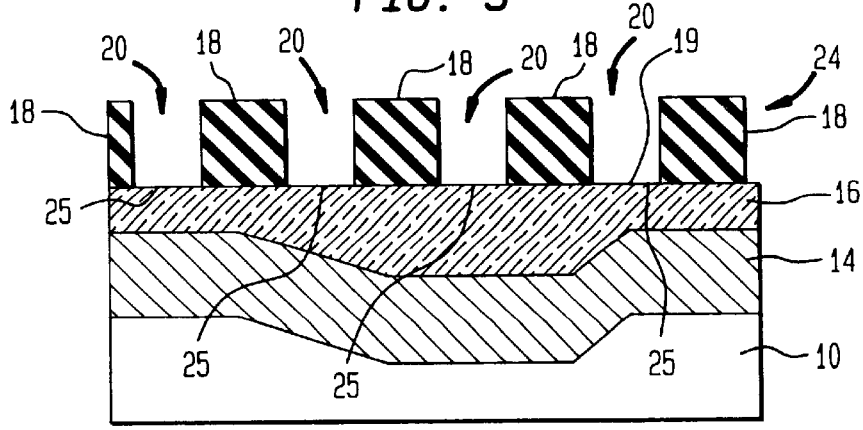

METHOD FOR FORMING METALLIZATION IN SEMICONDUCTOR DEVICES WITH A SELF-PLANARIZING MATERIAL

BACKGROUND OF THE INVENTION

This invention relates generally to metalization in semiconductor devices and, more particularly, to patterning a metal layer into a plurality of electrically conductive wires on an integrated circuit substrate.

As is known in art, in modern integrated circuit metalization processing, electrically conductive wires are formed over an integrated circuit substrate using photolithographic-chemical etching processes. In such process, a photoresist layer is deposited over the surface of a metal layer into which the conductive wires are to be formed. A mask having the desired pattern for the conductive wires placed over the photoresist layer. Light is projected onto the mask, such light passing through openings therein onto exposed portions of the photoresist layer. The photoresist layer is then developed with the light exposed regions thereof being removed. The patterned photoresist layer is used as an etching mask to etch away portions of the metal layer exposed by the developed photoresist mask. Thus, the patterned photoresist layer is transferred to the metal layer to thereby pattern the metal layer into the electrically conductive wires.

In forming conductive wires with widths in the order of one-quarter micron, it is necessary that the photoresist layer have an extremely high degree of planarity. However, when the metal layer is formed it has a non-planar surface because of the underlying surface is non-planar. Thus, if the photoresist layer is deposited onto the metalization layer, the photoresist layer being generally a non-conformal layer, will have a non-uniform thickness. One technique used to obtain a uniform thickness for the photoresist layer is planarizing the underlying surface upon which the metal layer is deposited using chemical mechanical polishing (CMP) techniques. Such CMP techniques, however, are relatively expensive.

SUMMARY OF THE INVENTION

In accordance with the present invention, a method is provided for forming a plurality of electrically conductive wires on a substrate. The method includes forming a relatively non-planar metal layer over a surface of the substrate. A self-planarizing material is deposited over the metal layer. The self-planarizing material forms a planarization layer over the surface of the metal layer. The planarization layer has a surface relatively planar compared to the relatively non-planar metal layer. A photoresist layer is deposited over the surface of the planarization layer. The photoresist layer has a planar surface and is patterned with a plurality of grooves to form a mask. The grooves expose underlying portions of the planarization layer. The photoresist mask is used as a mask to etch grooves in the exposed portions of the planarization layer. The etched planarization layer forms a second mask. The second mask exposes underling portions of the relatively non-planar metal layer. The second mask is used to etch grooves in the relatively non-planar metal layer and thereby form the plurality of electrically conductive wires in the metal layer. The wires are separated from each other by the grooves formed in the relatively non-planar metal layer.

In accordance with another feature of the invention, the step of forming the planarization layer comprises the step of spinning on the self-planarizing material.

In accordance with another feature of the invention, the spinning step comprises the step of spinning on an organic polymer, for example an organic polymer having silicon, or a flowable oxide, or a hydrogensilsequioxane, or divinyl-siloxane-benzocyclobutene.

In accordance with still another feature of the invention, the step of etching the metal layer comprises the step of using reactive ion etching.

BRIEF DESCRIPTION OF THE DRAWING

Other features of the invention, as well as the invention itself, will become more readily apparent from the following detailed description read together with the accompanying drawings, in which;

FIGS. 1, 2A, and 3–6 are cross-sectional diagrammatically sketches, showing a substrate having a plurality of electrically conductive wires formed thereon at various steps in the fabrication thereof in accordance with the invention; FIG. 2B being a cross-sectional diagrammatically sketch of the substrate at a step in the fabrication thereof in accordance the invention.

DETAILED DESCRIPTION

Figure 4:
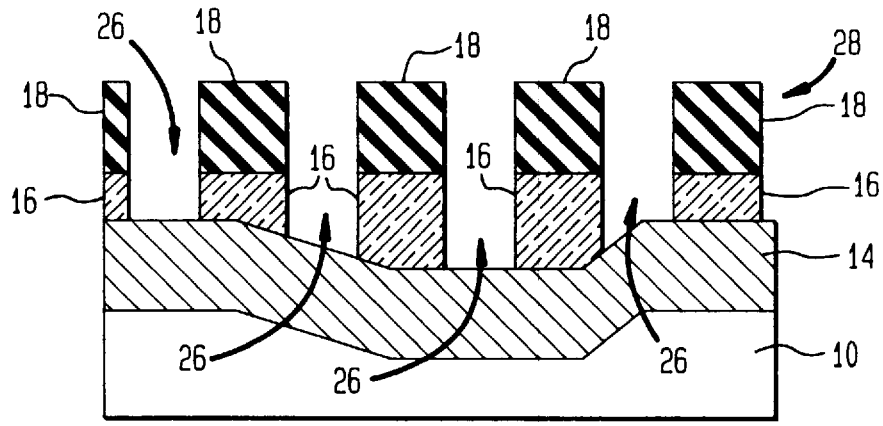

Referring now to FIG. 1, a semiconductor substrate 10 comprising, for example, silicon is provided. It is noted that the upper surface 12 of substrate 10 is relatively non-planar. Such non-planarity would typically be the result of formation of various elements or structures in the substrate 10. For example, the upper surface 12 of substrate 10 may be an electrically insulating layer 13 of silicon dioxide which was formed over gates and electrode contact regions (not shown) formed in an epitaxial layer of the silicon substrate 10.

A metal layer 14 is next formed over the substrate 10, more particularly on the upper, relatively non-planar surface 12 (i.e., on the electrically insulating layer 13) of the substrate 10, as shown in FIG. 1. Here, the metal layer 14 is a composite layer made up of a lower, relatively thin layer of titanium/titanium nitride, an intermediate, relative thick layer of sputtered aluminum; and an upper, thin anti-reflective coating (ARC) layer of titanium/titanium nitride. In any event, the deposition/sputtering processes used to form the metal layer 14 results in a conformal deposition. Thus, metal layer 14 has a uniform thickness so that its upper surface 15 is relatively nonplanar and conforms to the non-planar topography of the upper, non-planar surface 12 of the substrate 10, as shown in FIG. 1.

Next, referring to FIG. 2A, a planarization layer 16 is formed over the surface 15 of the metal layer 14. In accordance with the invention, the planarization layer 16 is formed as a non-conformal layer. That is, the planarization layer 16 is formed with an upper surface 18 which is substantially planar, as shown, compared to the relatively non-planar surface portions 15a, 15b, for example of the surface 15 metal layer 14.

In one embodiment, a self-planarizing material is deposited on the metal layer 14 to form the planarization layer 16. The planarization layer 16, for example, comprises spun-on silicon oxide glass (SOG). Other materials which may be used for spinning-on planarization layer 16 include: a flowable oxide such as hydrogensilsequioxane glass manufactured and sold by Dow-Corning as FOx-15; a silicon-containing, organic polymer; or divinyl-siloxane-benzocyclobutene. Spinning on such material results in a self-planarized layer 16. After being spun-on and after allowing the material to flow and thereby self-planarize, it is baked at about 150° C. to 350° C. for about one minute to remove any remaining solvent and allow reflow. The resulting planarization layer 16 (FIG. 2A) is relatively hard. The planarization layer is sufficiently thick such that its upper surface 19 is planar after being reflowed. Typically, the thickness of the planarization layer is of no more than 300 Å to 2000 Å.

Alternatively, the planarization layer 16 comprises, for example, a composite layer as shown in FIG. 2B. As shown, the composite planarization layer 16 includes a spun-on silicon dioxide glass as a bottom portion 16a and a cap or upper layer 16b formed thereon. The cap layer comprises a dielectric material. The cap layer promotes adhesion between the photoresist and the planarizing layer. In one embodiment, the cap layer 16b comprises silicon dioxide formed by, for example, plasma enhanced chemically vapor deposited (PE CVD). The silicon oxide is deposited by PE CVD at a temperature of about 400° C. or less and has a thickness sufficient to promote adhesion between the photoresist and the planarizing material. In one embodiment, the thickness of the cap layer is about 300–500 Å, preferably about 400–500 Å, even more preferably about 500 Å.

Next, a photoresist layer 18 (FIG. 3) is spun on the planar surface 19 of the planarization layer 16 (i.e., either the single planarization layer 16 shown in FIG. 2A or the composite planarization layer 16 shown in FIG. 2B). A mask (not shown) is used to expose portions of the photoresist with an exposure source from, for example, a conventional stepper lithography system. The portions of the photoresist exposed by the exposure source are polymerized. The photoresist layer is then developed to remove the exposed or polymerized portions, creating grooves or slots 20. The unremoved portions of the photoresist layer serves as a mask for patterning the underlying layers. As shown, the mask is used to pattern exposed portions 25 of the underlying planarization layer 16. The exposed portions 25, for example, correspond to regions electrically separating the electrically conductive wires to be patterned into the conductive metal layer 14. Alternatively, a negative photoresist layer 18 is used. The use of a negative photoresist results in the unexposed portions being developed away.

Referring to FIG. 4, the photoresist mask 28 is used to etch the exposed portions of the planarization layer within the grooves of the photoresist layer. The exposed portions are etched anisotropically by, for example, reactive ion etching (RIE). The planarization layer is RIE selective to the metal layer. That is, the planarization layer 16 etches at a higher rate than the metal layer 14. As such, the metal layer 14 serves as an etch stop layer for the RIE. The RIE exposes portions 26 of the metal layer 14. In one embodiment, the planarization layer is RIE using a fluorine ion chemistry such as, for example, $CH_4$, $C4F_8$, or $CHF_3$.

Next, using remaining portion of the photoresist masking layer 18, and the second mask 28 formed within the planarization layer 16, i.e., with the second mask 28 exposing underling non-planar surface portions of the metal layer 14), the exposed portions of the metal layer 14 are etched away using RIE to form the plurality of electrically conducive wires 36 over the dielectric layer 13, as shown in FIG. 4. (It is noted that the wires 36 run perpendicular to the plane of FIG. 4). In an exemplary embodiment, the RIE is performed using a chloride ion chemistry.

Figure 5:
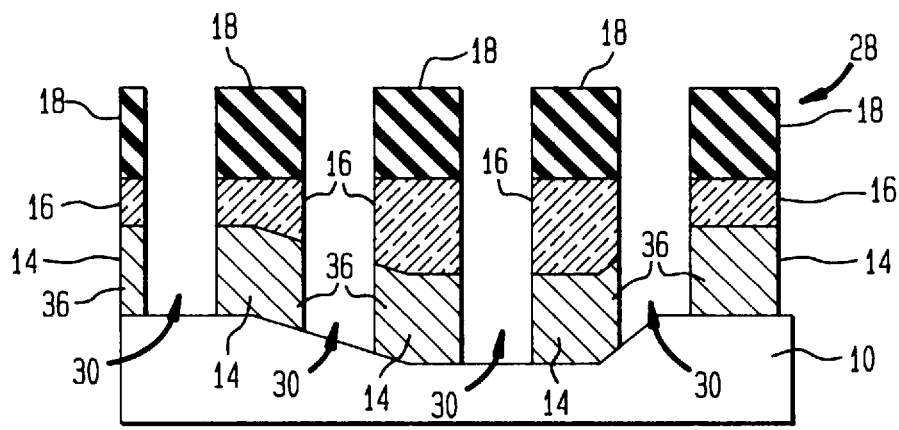
Figure 6:
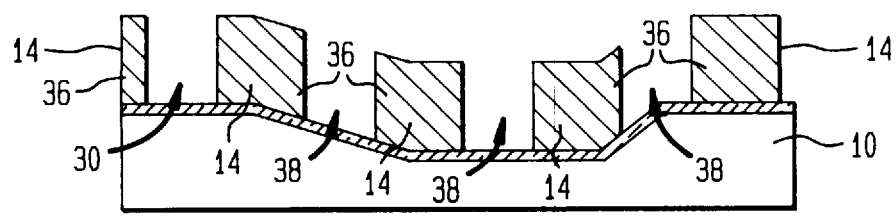

That is, using the second mask 28 (FIGS. 4 and 5) formed in the planarization layer 16, grooves 38 are etched into the relatively non-planar conductive metal layer 14 to form the plurality of electrically conductive wires 36. The wires 36 are electrically separated by the grooves 32 formed in the relatively non-planar metal layer 12 and by the dielectric layer 13 formed on the surface of the substrate 10, as shown in FIG. 6. Typically, the etch is selective to the material underlying the metal layer. As such, the underlying layer serves as an etch stop.

Next, the photoresist layer is stripped away. Then, the planarization layer 14 is removed using, for example, a wet chemistry. In one embodiment, the wet chemistry comprises a highly dilute HF (e.g., 200:1 water to HF) or a negative photoresist developer, producing the structure shown in FIG. 6. It is noted that if a second metalization layer is to be used, only the photoresist layer 18 is removed. Then, a planarized dielectric surface is deposited over the structure and into the grooves 28. Such planar dielectric structure may be formed by using SOG as in the formation of layer 16 as in FIG. 2A, or forming the composite layer 16 shown in FIG. 2B. Alternatively, a layer of silicon dioxide may be deposited over the surface of the grooved structure using subatmospheric chemical vapor deposition (SA CVD) or high density plasma deposition (HDP techniques. Next, the second metalization layer is deposited over the patterned planarization layer 16 (FIG. 5). It is noted that if the second metalization layer is not adequately planar, the self-planarizing material (i.e., layer 16) is spun over the surface of the second metalization layer and processed, as described above in connection with FIGS. 4–6 above, to provide a second plurality of conductive wires.

While the invention has been particularly shown and described with reference to various embodiments, it will be recognized by those skilled in the art that modifications and changes may be made to the present invention without departing from its scope. Merely by way of example, the self-planarizing material may be formed using a gaseous deposition process with similar flow properties as that obtained with the spun on glass material described above instead of using such spin deposited process. One such material which may be used with gaseous deposition is Flowfill material sold by PMT-Electrotech, Chatsworth, Calif. The scope of the invention should therefore be determined not with reference to the above description but with reference to the appended claims along with their full scope of equivalents.

What is claimed is:

1. A method for forming a plurality of electrically conductive wires on a substrate, comprising the steps of:

forming a relatively non-planar metal layer over a surface of the substrate;

depositing a self-planarizing material over the surface of the metal layer to form a planarization layer having a surface relatively planar compared to the relative non-planar metal layer, said planarization layer being formed by spinning on the self-planarizing material which comprises hydrogensilseguioxane;

depositing a photoresist layer over the surface of the planarization layer; patterning the photoresist layer, the patterned photoresist layer forming a mask to selectively expose portions of the planarization layer;

etching grooves into the exposed portion of the planarization layer and portions of the non-planar metal layer underneath the exposed portions of the planarization layer to form the plurality of electrically conductive wires, wherein the wires are separated by the grooves.

2. A method or forming a plurality of electrically conductive wires on a substrate, comprising the steps of:

forming a relatively non-planar metal layer over a surface of the substrate;

depositing a self-planarizing material over the surface of the metal layer to form a planarization layer having a surface relatively planar compared to the relatively non-planar metal layer, said planarization layer being formed by spinning on the self-planarizing material which comprises siloxane-benzocydobutene;

depositing a photoresist layer over the surface of the planarization layer;

patterning the photoresist layer, the patterned photoresist layer forming a mask to selectively expose portions of the planarization layer;

etching groves into the exposed portion of the planarization layer and portions of the non-planar metal layer underneath the exposed portions of the planarization layer to form the plurality of electrically conductive wires, wherein the wires are separated by the grooves.

3. A method for forming a plurality of electrically conductive wires on a substrate, comprising the steps of:

forming a metal layer over a relatively non-planer surface of the substrate, such metal having relatively non-planar surface portions;

depositing a planarization layer over the surface of the metal layer by spinning on a self-planarizing material selected from material consisting of hydrogensilsequioxane or divinyl-siloxane-benzocyclobutene, such planarization layer having a relatively planar surface compared to the relatively surface portions of the metal layer;

depositing a photoresist layer over the surface of the planarization layer;

patterning the photoresist layer with a plurality of grooves to form a mask with such grooves exposing underling portions of the planarization layer;

using the photoresist mask, etching grooves in the exposed portions of the planarization layer to form a second mask exposing underling non-planar surface portions of the metal layer; and using the mask formed in the planarization layer, etching grooves in the relatively non-planar metal layer to form the plurality of electrically conductive wires, such wires being separated by the grooves formed in the relatively non-planar metal layer.

* * * * *